United States Patent [19]

Dee et al.

[11] Patent Number: 4,849,250
[45] Date of Patent: Jul. 18, 1989

[54] METHOD AND APPARATUS FOR PRODUCING MAGNETICALLY ORIENTED FILMS ON SUBSTRATES

[75] Inventors: Richard H. Dee, Louisville; Laurence L. Rea, Denver; Darwin D. King, Loveland; Guy F. Ruse, Boulder, all of Colo.

[73] Assignee: Storage Technology Corporation, Louisville, Colo.

[21] Appl. No.: 148,944

[22] Filed: Jan. 27, 1988

[51] Int. Cl.$^4$ ............................................. B05D 3/14
[52] U.S. Cl. ..................................... 427/48; 118/50; 118/500; 118/722; 118/730; 204/192.2; 427/128; 427/255.5; 427/294; 428/694; 428/900
[58] Field of Search ................ 427/48, 128, 255.5, 427/294; 118/50, 500, 722, 730; 428/694, 900; 204/192.2

[56] References Cited

U.S. PATENT DOCUMENTS 3,908,194  9/1975  Romankiw .................. 306/113

FOREIGN PATENT DOCUMENTS 61-110414  5/1986  Japan .

OTHER PUBLICATIONS

J. K. Howard, Thin Films for Magnetic Recording Technology: A review; Jan.-Feb. 1986, J. Vac. Sci. Technol. A.

Yasuhiro Nagai and Tomoyuki Toshima, Magnetoresistance Effect of Ni-Fe Film Formed by Ion Beam Sputtering, Sep./Oct. 1986, J. Vac. Sci. Technol. A.

IBM Technical Disclosure Bulletin, vol. 27, No. 10B, Mar. 1985, Method of Manufacturing Thin Films with Magnetic Anisotropy.

IBM Technical Disclosure Bulletin, vol. 28, No. 3, Aug. 1985, Reverse Shunt Bias Thin Film Process.

T. R. McGuire and R. I. Potter, ANISOTROPIC MAGNETORESISTANCE IN FERROMAGNETIC 3RD ALLOYS, IEEE Transactions on Magnetics, Jul. 1975, pp. 1018-1038.

Primary Examiner—Bernard Pianalto
Attorney, Agent, or Firm—Dorr, Carson, Sloan & Peterson

[57] ABSTRACT

A method and apparatus is disclosed for permitting a plurality of substrates to be positioned within a magnetic field unique to each substrate so that the plurality of substrates may be placed in a vacuum chamber and concurrently coated with a thin film. A magnetic field unique to and associated with each substrate may be oriented so that all substrates have a uniform magnetic field and magnetic orientation. Alternatively, the magnetic field and orientation of each substrate may be individually tailored to produce a different magnetic characteristic for each substrates.

13 Claims, 5 Drawing Sheets

METHOD AND APPARATUS FOR PRODUCING MAGNETICALLY ORIENTED FILMS ON SUBSTRATES

FIELD OF THE INVENTION

This invention relates to a method and apparatus for concurrently depositing a magnetically oriented film on a plurality of substrates in a single operation.

BACKGROUND OF THE INVENTION

It is known to deposit a magnetically oriented film on substrates by the steps of (1) selecting a suitable substrate, (2) placing the substrate in a chamber, (3) removing the air from the chamber to create a vacuum, (4) subjecting the substrate to a magnetic field that is contrtolled both with respect to its direction of orientation and intensity, and (5) depositing nickel iron or permalloy or any other suitable material onto the substrate by means of a suitable procedure such as, for example, by sputtering. The sputtering operation is continued until the deposition layer is of the required thickness. The above procedure is used to produce thin film material having magneto-resistive properties. Magneto-resistive materials are used in the thin film rad heads of magnetic writing and reading devices.

Typically, the substrate on which the magnetic film is to be deposited is positioned in a vacuum chamber with the entire chamber, including the substrate, being subjected to a magnetic field produced by large coils exterior to the chamber. Such an arrangement is shown by J. K. Howard in the Journal of Vacuum Science Technology A, 4, 1, on pages 1 through 13 of the January/February 1986 issue. Such an arrangement is also discussed by T. R. McGuire and R. I. Potter in the IEEE Transactions on Magnetics, Mag.11, 1018, July 1975 on pages 1018 through 1038. It is also known to provide the required oriented magnetic field by simply placing a magnet on the back of the substrate. This method uses the fringing fields from the magnet for orientation. However, depending on the magnet size, the field is not very uniform over significant area. Thus, with this procedure, only a substrate having a small area can be used. This is discussed by Yasuhiro Nagai and Tomoyuki Toshima in the Journal of Vacuum Science Technology, A, 4, 2364, 1986 on pages 2364 through 2368.

While the above procedures are reasonably suitable for use when only a single substrate at a time is to be produced, they are inadequate for the mass production of substrates having oriented magnetic fields since only a single substratea can be produced at a time if precision control of the produced filed is to be achieved. While a plurality of substrates could perhaps be positioned adjacent one another in a vacuum chamber and be subjected to a single magnetic field and a sputtering operation, the results produced by such a procedure would not be acceptable since the magnetic orientation of the plurality of substrates would not be identical. It is desirable that the substrates and the thin film heads in which the substrates are used, have a magnetic orientation that differ from each other by no more than by an amount termed an error angle. This angle must be within plus or minus 4 degrees from a specified direction of magnetic orientation. Thus, while a plurality of substrates could be produced at the same time from a single magnetic field merely by placing the plurality of substrates within the magnetic field of a single magnet, the resultant devices produced by this procedure would not be commercially acceptable since they would have differing directions of magnetic orientation. It can therefore be seen that it is a problem to produce in high volumes a plurality of substrates each of which has a magnetic orientation equal to the other concurrently produced substrate.

SUMMARY OF THE INVENTION

The present invention solves the above-discussed problem by providing a method for depositing a precisely oriented magnetic film, such as nickel iron, conccurrently ohn a plurality of substrates (both magnetic and non-magnetic substrates) to yield a plurality of magneto-resistive devices in a single vacuum operation. The present invention also provides apparatus comprising a fixture for receivign a plurality of substrates, for positioning these plurality of substrates in a plurality of magnetic fields of which there is a unique field for each substrate and in a sputtering operation for depositing each substrate with a preselected substance such as, for example, permalloy.

The provided apparatus comprises a substrate tray having a plurality of recesses into which a corresponding plurality of substrates may be inserted. Each substrate is held in its recess by means of a suitiable spring clip. This substrate tray is then positioned beneath a second fixture, termed a magnetic pole piece assembly, which has a corresponding plurality of magnets so that there is a magnet unique to each substrate on teh substrate tray. The substrate tray has spacer bars on its top side which define the minimum distance that the tray can be separated from the pole piece assembly when the tray is positioned below the pole piece assembly. Indexing pins and other suitable interlocking arrangements are provided so that when the substrate tray is positioned beneath the pole piece assembly, each substrate is positioned intermediate the pole pieces of its associated magnet. Thet ray and the assembly are then positioned within a suitable vacuum chamber, the vacuum chamber is sealed, air is evacuated from the vacuum chamber and a sputtering operation is performed to deposit the desired material on each substrate. The tray and the pole piece assembly are rotated about their central vertical axis during the sputtering operation. The sputtering operation persists for a duration of time sufficient to deposit a layer of suitable thickness on each substrate.

The apparatus provided in accordance with the present invention is advantageous in that it permits a plurality of substrates to be coated concurrently with a thin fil with each substrate having a uniform magnetic field. The directional uniformity in the area of significance (i.e. the area of the substrate's surface) is controlled by the pole pieces of a magnet associated with each substrate. The zone of interest of each substrate is enclosed within two magnetic pole pieces whose size, shape and direction are calculated to provide a directional uniform field (plus or minus 4 degrees) over the area of the substrate. The substrates may advantageously may be rectangular and have dimensions of 40 millimeters by 40 millimeters. The field produced by each magnet is localized to the substrate associated with the magnet and does not affect either the other substrates or the system as a whole. The field uniformity and the effects of close spacing of the substrate sites is controlled in advance by proper calculations. This includes any interaction between neighboring substrate sites. The deposition can be made from a single soruce of raw material and the plurality of substrates may be rotated multiple times thorugh the deposition zone of the vacuum chamber. If field uniformly between all substrates is not desired, the magnets may be different in either strength or directional orientation so as to rpoduce substrates having films of different specified characteristics.

DESCRIPTION OF THE DRAWINGS

These and other advantages of the invention may be better understood from a reading of the following description taken in conjunction with the drawings in which:

FIG. 3illustrates the magnetic orientation of a formed substrate;

FIG. 7 illustrates a cross-sectional view taken along lines C/C of FIG. 5, and

DETAILED DESCRIPTION

Figure 1:
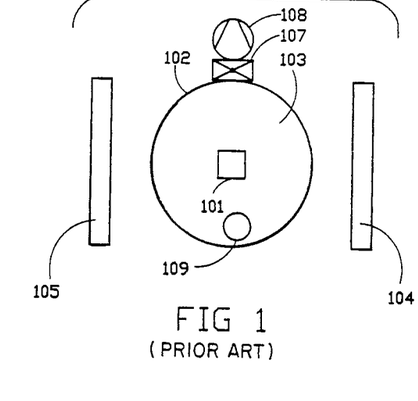
FIG. 1 illustrates a substrate positioned in a magnetic field.

FIG. 1 illustrates a prior art sputtering arrangement comprising a substrate 101 positioned within a vacuum chamber 102. The vacuum chamber 102 and the substrate 101 are positioned intermediate the pole pieces 104 and 105 of an external magnet. The pole pieces 104 and 105 may either be the pole pieces of a permanent magnet or, alternatively, they may be coils of an electromagnet. Air is removed from the interior 103 of chamber 102 by valve 107 and vacuum pump 108 prior to the beginning of a sputtering operation by sputtering source 109 to deposit a film of suitable material on substrate 101. The substrate 101 may be ositioned as desired between the pole pieces 104 and 105 so that the substrate is subject to a controlled magnetic field during the sputtering operation. The sputtering operation persists for the duration of time required to deposit a layer of suitable thickness on the substrate. The apparatus of the present invention is comparable to that of FIG. 1 except that external magnetic pole pieces are not provided. Instead the magnets used by the apparatus and process of the present invention are positioned on specially provided apparatus within chamber 102.

Figure 2:
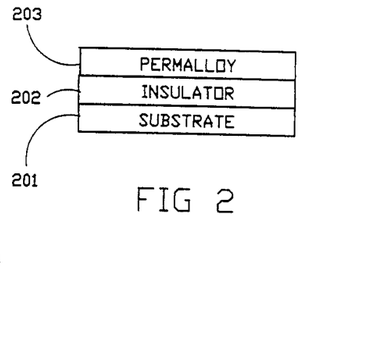
FIG. 2 illustrates a substrate of the type to which the invention pertains.

FIG. 2 illustrates a cross sectional view of a substrate 201 having an insulator layer 202. The insulator layer 202 is formed on substrate 201 prior to the initiation of the operation associated with the present invention. The substrate 201 having an insulator layer 202 is positioned within chamber 101 of FIG. 1 in order thatmaterial, such s a permalloy layer 203, may be formed on the top surface of the insulator layer 202.

It is desired that the permalloy layer 203 be subjected to a magnetic field that is precisely controlled with regard to its intensity and direction during the sputtering operation. Ideally, s shown in FIG. 3, the magnetic fields should be uniform and parallel to one another such as is shown for the magnetic field lines 303, 304 and 305, all of which are parallel tot op side 302 of the substrate 301. Manufacturing tolerances permit the magnetic field to have an error angle of no more than plus orminus 4 degrees. An error angle 307 is illustrated on FIG. 3 and comprises the angle formed between line 303, which represents the desired direction of the magnetization, and line 306 which represents the direction of the maximum error angle permitted. All lines of magnetization, including lines 304 and 305, also have associated error angles (not shown) associated with them.

Figure 4:
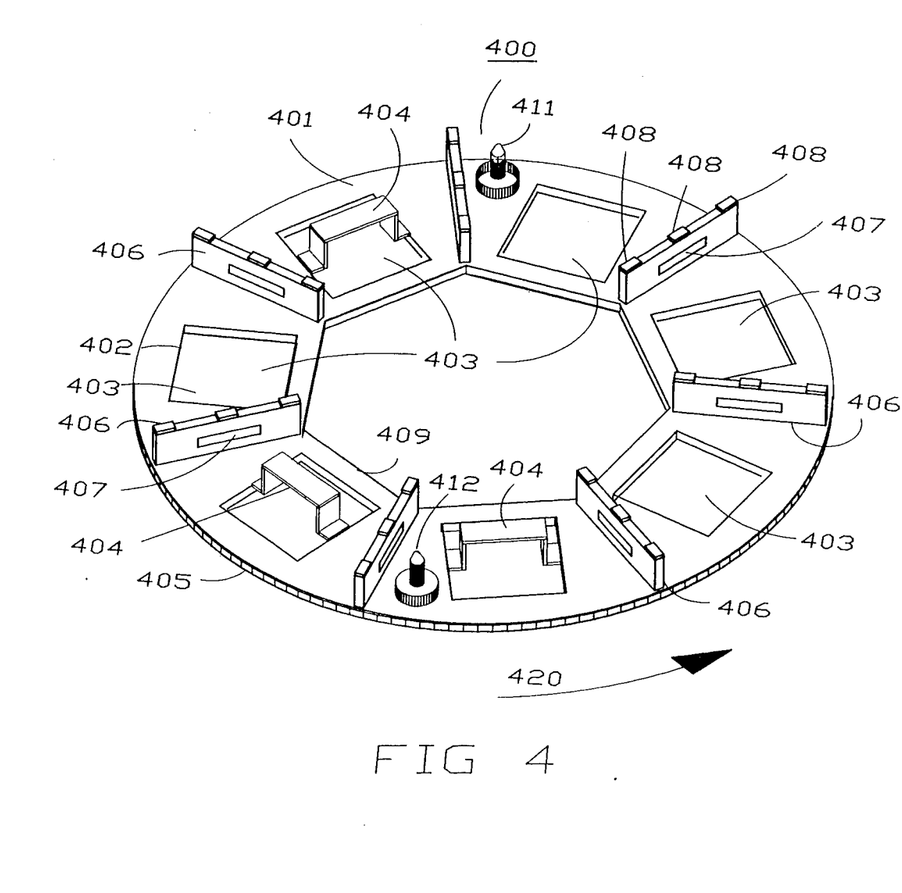
FIG. 4 illustrates a substrate tray.

Description of FIG. 4

FIG. 4 illustrates substrate tray 400 of the present invention. Tray 400 is a generally circular or annular and has a top surface 401, an outer circumference 405 and an interior having seven sides such as 409. The top surface 401 has a plurality of recesses 402 therein. Seven recesses 402 are shown on FIG. 4. The recesses 402 are adapted to receive rectangular substrats 403. Some of the substrates 403 are shown held firmly within the recesses 402 by means of retainer springs 404. Springs 404 are to be added to the other substrates. The details of how retainer springs 404 hold substrates 403 within recesses 402 are subsequently described.

The top surface 401 has affixed thereto a plurality of perpendicularly and radially oriented spacer bars 406. Seven spacer bars 406 are shown. Each spacer bar has an opening 407 whose purpose is subsequently described. Each spacer bar 406 also has three protrusions 408 on its upper surface. Protrusions 408 rae used as subsequently described to position the substrate tray 400 in a predetermined orientation beneath the a magnetic pole piece assembly that is subsequently described in detail. Substrate tray 400 also has index pins 411 and 412 which are differently shaped on their upper tips and which are used to orient the substrate tray 400 in a precise rotational orientation beneath the magnetic pole piece assembly.

The overall purpose of substrate tray 400 is to receive the seven substrates 403 prior to the initiation of a deposition operatoin and to hold substrates 403 firmly within each recess 402. The spacers bars 406, the protrusions 408 and hte index pins 411 and 412 provide a precisely controlled distance of separation and directional orientation between the substrate tray and the magnetic pole piece assembly. The spacers bars 406 control the minimum distance of separation. The index pins 411 and 412 control the rotational orientation between the substrate tray 400 and the magnetic pole piece assembly. Tray 400 rotates during a sputtering operation as portrayed by the circular arrow 420.

Figure 5:
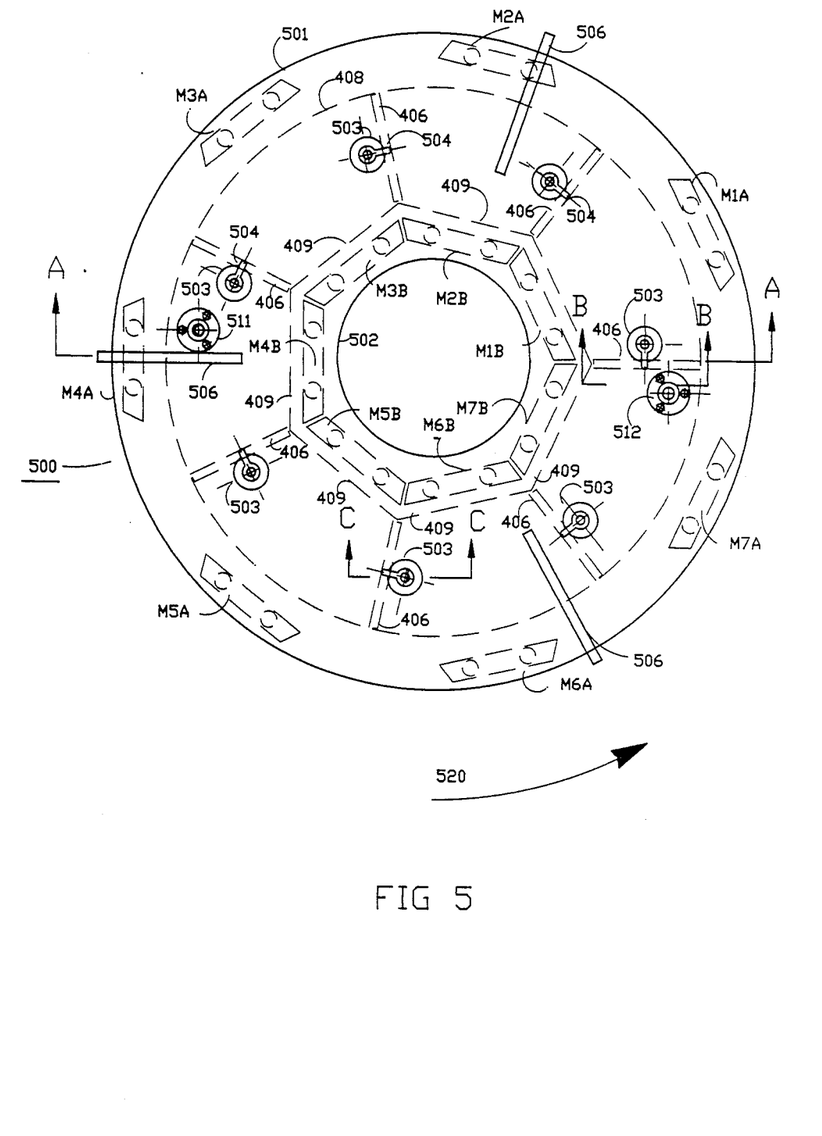
FIG. 5 illustrates the magnetic pole piece assembly.
Figure 6:
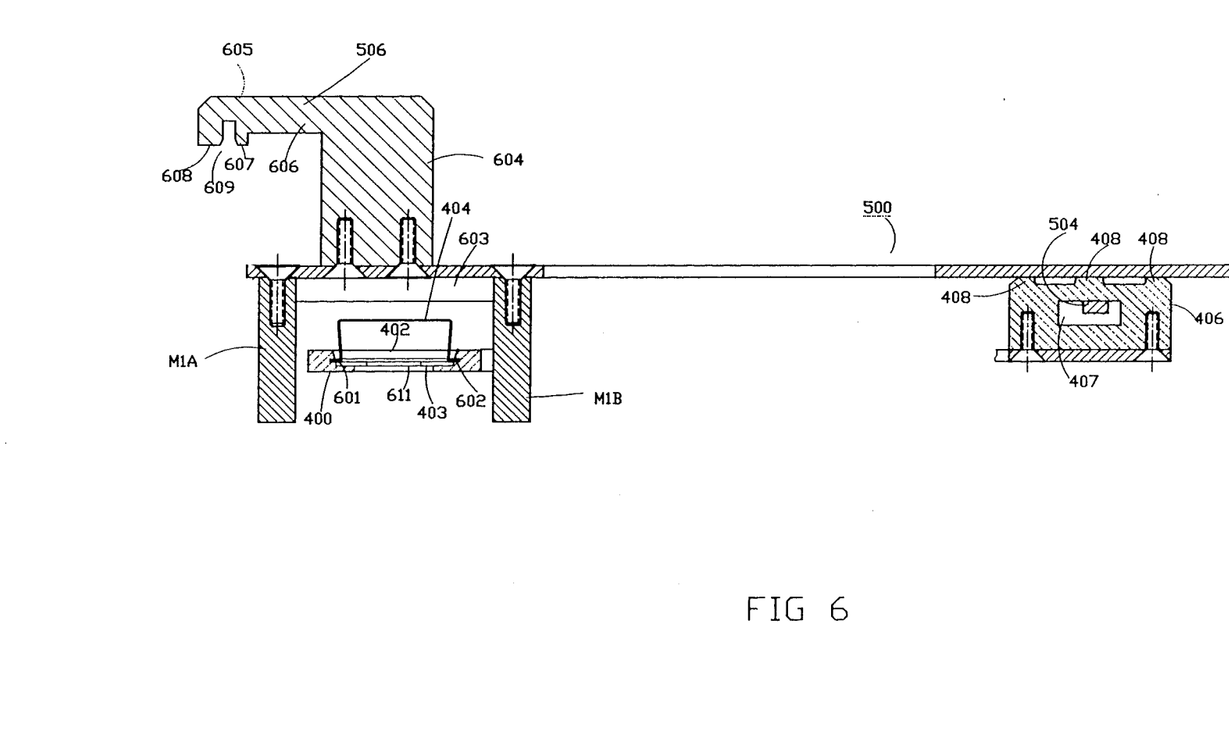
FIG. 6 illustrates a cross-sectional view taken along lines A/A of FIG. 5.

Description of FIGS. 5 and 6

FIG. 5 discloses a top view of magnetic pole piece assembly 500 which is annular and which on its bottom side receives the substrate tray 400 of FIG. 4. FIG. 5 discloses as solid lines the details of assembly 500 that may be seen from a top view. The dashed lines illustrate elements ounted on the bottom surface of assembly 500. Additionally shown as dashed lines are ceratin elements associated with substrate tray 400 when tray 400 is positioned immediately below and attached to the bottom surface of assembly 500. Assembly 500 has an outer circumference 501 and an inner circumference 502. Assembly 500 is functionally divided into seven segments or positions.

The magnetic pole piece asasembly 500 hsa three radially oriented hanger elements 506 as shown on FIG. 5. These hanger elements are shown in further detail on FIG. 6 and enable the magnetic pole piece assembly 500 to be attached to and supported by hardware, such as a circular ring, when the magnetic pole piece assembly 500 and the attached substrate tray 400 are inserted into a vacuum chamber such as 102. This circular ring that supporst magnetic pole piece assembly 500 is a part of the vacuum chamber apparatus 102 and does not comprise a portion of hte present invention. It is shown diagramatically as element 803 on FIG. 8. All that need be understood in this regard is that the hardware, such as a circular ring, that supports the magnetic pole piece 500 is a part of the vacuum chamber apparatus and its function is to support apparatus of different types that may be inserted into the vacuum chamber at different times and for different purposes.

Figures 3, 7:
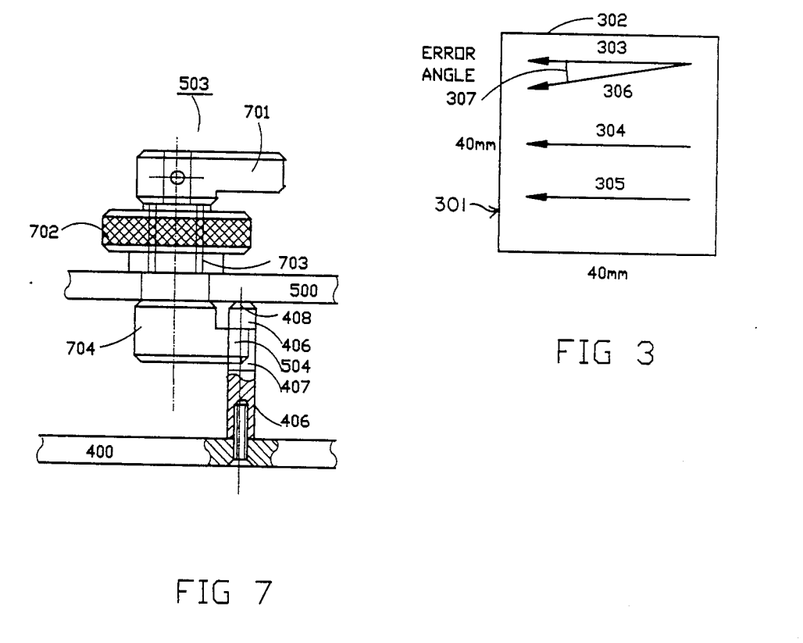

Each of the seven ositions of the magnetic pole piece assembly 500 includes a latch element 503. The top portion of hte latch is shown in solid lines on FIG. 5. The details of the latch are shown in FIG. 7. The purposeof the latch elements 503 is to enable th spacer bars 406 of substrate tray 400 to be rigidly affixed and clamped to the bottom side of magnetic pole piece assembly 500. Further shown on FIG. 5 are index sockets 511 and 512. These sockets receive index pins 411 and 412, respectively, of substrate tray 400. Index pin 411 is insertable into socket 511 while index pin 412 is insertable into socket 412. The purpose of the index pins and the sockets 511 and 512 is to align te substrate tray 400 and the magnetic pole piece assembly 500 in a fixed predetemined rotational orientation about the center vertical axis common to and perpendicular to both of these elements. This is the axis that is perpendicular to both of these elements and passes through their geometric centers on FIGS. 4 and 5.

Each segment or position of magnetic pole piece assembly 500 has a magnet fixed to the bottom portion of the plate comprising assembly 500. Eachmagnet and its pole pieces are shown in dashed lines on FIG. 5 since they are on the bottom side of assembly 500. The pole pieces for the magnet associated with position 1 are designated M1A and M1B. The pole pieces of the magnets associated with othe rpositions are designated in a corresponding manner. For example, the magnetic pole pieces associated with position 6 are designated M6A and M6B. The magnetic pole pieces are secured to the bottom of the assembly plate 500 by means of the screws shown on FIG. 5. The spacer bars 406 attached to substrate tray 400 are shown in dashed lines on FIG. 5 since the top portion of the spacer bars 406 contact the bottom portion of the magnetic pole piece assembly 500 when the substrate tray 400 is positioned beneath and then clamped to the bottom of the magnetic pole piece assembly plate 500. If desired a plurality of magnets may be associataed with each position of assembly tray 500.

The right side of FIG. 6 shows how the magnetic pole piece assembly tray 500 receives the three protrusions 408 of a spacer 406. Spacer 406 has opening 407 which receives the wing 504 of a latch 503. As can be seen, wing 504 securely holds spacer 406 fimrly against the bottom of plate 500. The left side of FIG. 6 shows the apparatus associated with this portion of assembly plate 500. Affixed to the top surface of assembly plate 500 on the left side is a hanger 506. The hanger 506 has a vertical portion 604 having a lower surface which is affixed by means of screws to the to psurface of plate 500. Hanger 506 also has a top horizontal surface 605 which is terminated on its left side by a downwardly projecting opening 609 defined by the left jaw 608 and the right jaw 607. The opening 609 is designed to receive apparatus such as a bar or the like to support hanger 506 and asembly plate 500 as well as substrate tray 400 when tray 400 is firmly affixed to the bottom of plate 500.

FIG. 6 also shows one of themagnet pole piece assemblies that is affixed to the bottom surface of assembly 500. This magnet assembly comprises an outer pole piece M1A, an inner pole piece M1B and a horizontal magnet portion 603 which connects the two pole pieces M1A and M1B. FIG. 6 also shows a segment of the substrate tray 400.This tray has mounted thereon the substrate 403 2hich is positioned within the recess 402 and which rests on a bottom surface 611 of the recess 402. The retainer spring 404 has U-shaped portions 601 and 602 on its right and left bottom extremities with these U-shaped portions having an upward protrusion which fits into grooves or channels in each side of recess 402. By this means, retainer spring 404 securely holds substrate 402 so that it cannot move during the deposition operation.

Description of FIG. 7

FIG. 7 discloses further details of the latch 503 associated with each of the seven positions of assembly plate 500.The latch 503 includesa top handle 701 and a knurlled handle portion 702 which is ridigly affixed to shaft 703 and which mvoes with the rotation of handle 701. The shaft 703 extends downward through plate 500 and is affixed to bttom latch element 704 which has a wing portion 504 The wing 504 rotates with the rotation of handle 701 and enters the opening 407 of spacer bar 406. At this time, the spacer bar 406 and its upper protrusions 408 are fimrly held against the bottom surface of assembly plate 500. By this means, the seven spacers 406 and the seven latches 503 define the minimum distance between the bottom surface of assembly 500 and the top surface of substrate tray 400.

Figure 8:
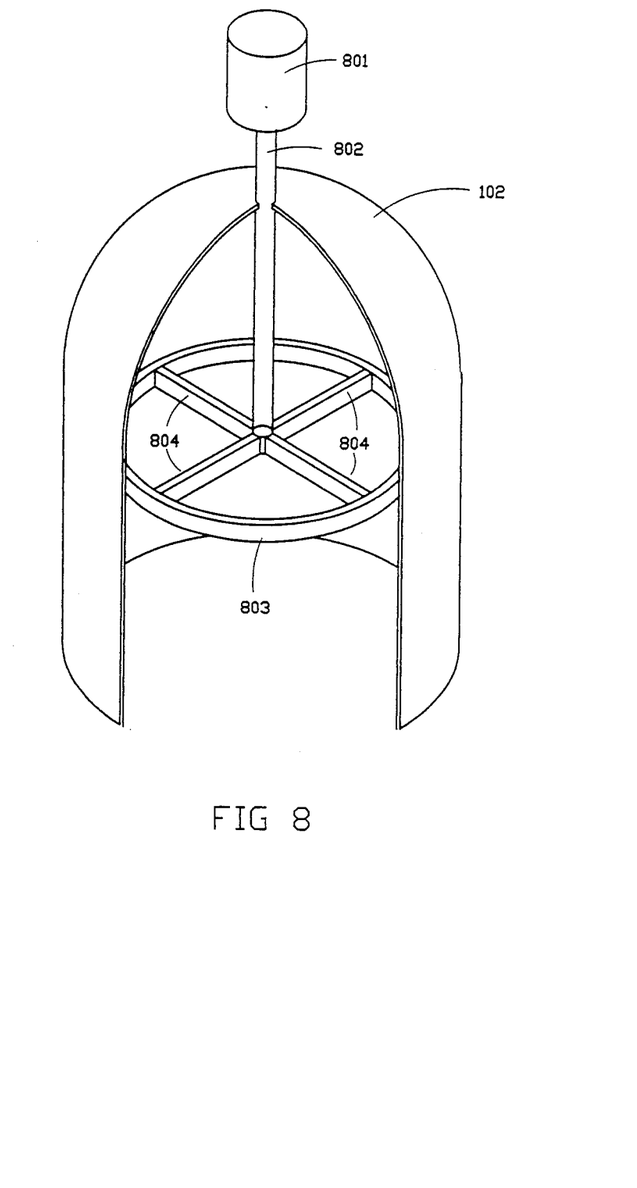
FIG. 8 illustrates the apparatus used to rotate the pole piece assembly and substrate tray.

FIG. 8 diagramaticall disclosed how the assembly plate 500 and tray 400 are rotated during a sputtering operation. Motor 801 is affixed to vertical shaft 802 which extends through vacuum chamber 102 and which is attached at its bottom and by spokes 804 to ring 803. The jaws 607 and 608 of hanger 506 (FIG. 6) engage ring 803 to support assemlby 500 and tray 400. Motor 801 is operated during a sputtering operation. This causes shaft 802 to rotate and, in turn, rotate assembly 500 and tray 400 to achieve optimal deposition.

In summary, it can be seen that the disclosed apparatus provided in accordance with the present invention is advantageous in that it permits a plurality of substrates to be coated concurrently in a single operation involving one pump-down or evacuation of the associated vacuum chamber. This permits a thin film to be deposited concurrently on a plurality of substrates. This is conducive to the production of the substrates in the quaantities reuired for a commercial production of these devices. The apparatus of the present invention is further advantageous in that each substrate is associated with a different magnet structure which can be adjusted as desired to produce a substrate having the desired strength of magnetic field and the desired magnetic orientation. This is a prerequisite when substrates are to be produced having the magneto-resistive characteristics associated with the read heads of present day recording and playback apparatus.

While a specific embodiment of the invention has been disclosed, it is expected that those skilled in the art can and will implement variations of the preferred embodiment disclosed therein, which variations still fall within the scope of the appended claims.

We claim:

1. A method of depositing a magnetically oriented film concurrently on a plurality of substrates, said method comprising the steps of:

placing said plurality of substrates in a chamber with each substrate being positione dwithin the magnetic field of a different one of a corresponding plurality of pairs of pole pieces of a corresponding purality of magnets with their being one of said magnets and one pair of said pole pieces unique to each substrate, said magnetic field associated with each of said substrates being controlled by and determined by the characteristics of said magnet and said pair of pole pieces unique to each substrate;

creating a vacuum within said chamber; and activating a deposition means for depositing a magnetically oriented film on each of said substrates with the intensity of magnetization and magnetic orientation of said film deposited on each of said substrates being determined by the magnetic field unique to each of said substrates and produced by said magnet and said pair of pole pieces of said magnet unique to each of said substrates.

2. A method of depositing a magnetically oriented film concurrently on a plurality of substrates, said method comprising the steps of:

mounting a corresponding plurality of magnets, each of which has a pair of pole pieces, in different predetermined locations on a first substantially flat member;

mounting each one of said substrates in a different predetermined location on a second substantially flat member;

positioning said second member parallel to and adjacent to said first member so that aid first member and second member have a common axis perpendicular to both of said members and so that each of said substrates is within the magnetic field of a different one of said pairs of pole pieces;

positioning said first and second members within a chamber while ach of siad substrates remains within the magnetic field of one of said pairs of pole pieces;

creating a vacuum within said chamber; and activating a deposition means for depositing a magnetically oriented film on each of said substrates with the intensity of magnetization and magnetic orientation of said film deposited on each of said substrates being determined by the magnetic field produced by the one of said magnets and pair of pole pieces unique to each of said substrates.

3. The method of claim 2 wherein said step of positioning said first member further comprises the step of positioning said first member horizontally within said chamber and wherein the step of positioning said second member further comprises the step of positioning said second member horizontally and a predetermined distance beneath said first member with said predetermined distance being defined by appartaus on said second member.

4. A method of producinga m agnetically oriented film concurrently on a plurality of substrates, said method comprising the steps of:

functionally dividing a substantially flat horizontally oriented annular magnetic pole piece assembly into a plurality of approximately equal sized annular sections;

mounting a different one of aplurality of magnets, each of which has a pair of pole pieces, on a bottom surface each of one of said annular sections;

functionally dividing a substantially flat horizontally oriented annular substrate tray into a plurality of annular sections corresponding in number to said plurality of annular sections of said pole piece assembly;

mounting a corresponding plurality of substrates in different ones of said annular sections of said substrate tray so that there is one of said substrates in each one of said sections of said substrate tray;

positioning said substrate tray praallel to and beneath said pole piece assembly so that each of said substrates is between a apir of pole pieces of a different one of said magnets;

positioning said pole piece assembly and said substrate tray horizontally within a chamber while maintaining each of said substrates between said pole pieces of a different one of said magnets, creating a vacuum within said chamber; and activating a deposition means for depositing a magnetically oriented film on each of said substrates with the intensity of magnetization and magnetic orientation of said film deposited on each substrate being determined by the pole pieces of the one of said magnets unique to each said substrate.

5. The method of claim 4 wherein said assembly and said tray are rotated about their common vertical axis during said deposition of said film on said substrates.

6. Apparatus for depositing a magnetically oriented film concurrently on a plurality of substrates, said apparatus comprising:

a pluralityof magnets, each of which has a pair of pole pieces, positioned in a chamber with each one of said plurality of magnets being mounted in a different location on a surface of a first substantially flat member positioned within said chamber;

a corresponding plurality of substrates positioned in said chamber with each substrate being positioned between a piar of pole pieces of a different one of said magnets with each one of said plurality of substrates being mounted in a different one of a plurality of locations on a second substantially flat member;

said second member being positioned adjacent to and parallel to said first member so that said first member and said secondmember share a common axis perpendicular to said first member and to said second member;

means for creating a vacuum within said chamber; and means operable for depositing a magnetically oriented film on each of said substrates with the intensity of magnetization and magnetic orientation of said film deposited on each one of said substrates being determined by the pair of pole pieces of the one of said magnets unique to each said substrate.

7. Apparatus for depositing a magnetically oriented film concurrently on a plurality of substrates, said apparatus comprising:

a substantially flat annular magnetic pole piece assembly having a plurality of substantially equal sized annular sections with said assembly being horizontally positioned within a chamber;

a corresponding plurality of magnets each of which has a pair of pole pieces with a different one of said magnets being mounted on a bottom surface of each of said annular sections of said pole piece assembly;

a substantially flat annular substrate tray having a plurality of annular sections corresponding in number to said plurlaity of annular sections of said pole piece assembly;

a corresponding plurality of substrates with there being a different one of said substrates mounted on a top surface in each of said sections of said substrate tray;

said substrate tray being positioend beneath and parallel to said pole piece assembly so that each of said substrates is between a pair of pole pieces of a different one of said magnets;

means for removing air from said chamber; and a sputtering means operable for depositing a magnetically oriented film on each of said substrates with the intensity of magnetization and magnetic orientation of each of said films being determined by said pair of pole pieces of the one of said magnets unique to each of said substrates.

8. The apparatus of claim 7 in combination with spacer bars on said top surface of said substrate tray for controlling the minimum spacing between said substrate tray and said pole piece assembly when said substrate tray is positioned beneath and parallel to said pole piece assembly.

9. The apparatus of claim 8 in combination with indexing means for fixably positioning in a predetermined relationship the rotational orientation of said substrate tray and said assembly about a vertical axis common to said tray and said pole piece assembly.

10. The apparatus of claim 9 in combination with means for latching together said substrate tray and said pole piece assembly to prevent vertical movement therebetween.

11. The apparatus of claim 10 wherein each of said substrates is mounted within a depression formed within said top surface of the one of said annular sections containing each said substrate on said substrate tray.

12. The apparatus of claim 11 in combination with a retainer means for holding each of said substrates firmly within the one of said depressions containing said each substrate.

13. The apparatus of claim 7 in combination with means for rotating said assembly and said tray about said common vertical axis.

* * * * *